US010833693B2

(12) United States Patent
Björk et al.

(10) Patent No.: US 10,833,693 B2
(45) Date of Patent: Nov. 10, 2020

(54) TIME-INTERLEAVED ANALOG-TO-DIGITAL CONVERTER SYSTEM

(71) Applicant: Telefonaktiebolaget LM Ericsson (publ), Stockholm (SE)

(72) Inventors: Vimar Björk, Gothenburg (SE); Claes Rolén, Uddevalla (SE)

(73) Assignee: TELEFONAKTIEBOLAGET LM ERICSSON (PUBL), Stockholm (SE)

(*) Notice: Subject to any disclaimer, the term of this patent is extended or adjusted under 35 U.S.C. 154(b) by 0 days.

(21) Appl. No.: 15/563,963

(22) PCT Filed: May 29, 2015

(86) PCT No.: PCT/EP2015/062036
§ 371 (c)(1),
(2) Date: Oct. 3, 2017

(87) PCT Pub. No.: WO2016/192763
PCT Pub. Date: Dec. 8, 2016

(65) Prior Publication Data
US 2018/0138919 A1 May 17, 2018

(51) Int. Cl.
*H03M 1/00* (2006.01)
*H03M 1/10* (2006.01)
*H03M 1/12* (2006.01)

(52) U.S. Cl.
CPC ....... *H03M 1/1038* (2013.01); *H03M 1/1004* (2013.01); *H03M 1/1215* (2013.01)

(58) Field of Classification Search
CPC . H03M 1/1038; H03M 1/1004; H03M 1/1215
(Continued)

(56) References Cited

U.S. PATENT DOCUMENTS 7,138,933 B2 * 11/2006 Nairn ................ H03M 1/0626
341/141
7,394,415 B2 * 7/2008 Fuse ................ H03M 1/1038
341/120
(Continued)

FOREIGN PATENT DOCUMENTS

CN 104467842 A 3/2015
EP 1401105 A1 3/2004
(Continued)

OTHER PUBLICATIONS

Wang, X. et al., "A 12-Bit 20-Msample/s Pipelined Analyog-to-Digital Converter with Nested Digital Background Calibration", IEEE Journal of Solid-State Circuits, Nov. 2014, pp. 1799-1808, vol. 39, No. 11.
(Continued)

*Primary Examiner* — Peguy Jean Pierre
(74) *Attorney, Agent, or Firm* — Coats & Bennett, PLLC

(57) ABSTRACT

It is provided a provided a time-interleaved analog-to-digital converter (ADC) system comprising an input port configured to receive an analog signal, an ADC-array comprising M, M≥2, ADCs arranged in parallel. Each ADC is configured to receive and to convert a portion of the analog signal into a digital signal at a sample rate $f_s$. The ADC-system further comprises a reference ADC configured to receive and to convert the analog signal into a digital reference signal at an average sampling rate $f_{ref}$ lower than $f_s$. Each sampling instant of the reference ADC corresponds to a sampling instant of an ADC in the array of ADCs, and the ADC to select for each reference ADC sampling instant is randomized over time. The ADC-system also comprises a correction module configured to adjust the digital signal outputs of the ADC-array into a corrected digital output signal based on samples of the digital reference signal and the digital signals
(Continued)

from the corresponding selected ADCs. It is also provided a method for time-interleaved analog-to-digital conversion.

21 Claims, 9 Drawing Sheets

(58) Field of Classification Search
USPC .................. 341/155, 159, 161, 118, 120, 122
See application file for complete search history.

(56) References Cited

U.S. PATENT DOCUMENTS

| | | | |
|---|---|---|---|
| 9,143,149 B1* | 9/2015 | van Engelen | H03M 1/38 |
| 9,287,889 B2* | 3/2016 | Chiu | H03M 1/1009 |
| 9,294,112 B1* | 3/2016 | Devarajan | H03M 1/121 |
| 9,401,726 B2* | 7/2016 | Ragab | H03M 1/0626 |
| 9,654,133 B2* | 5/2017 | Speir | H03M 1/1019 |
| 2009/0131010 A1 | 5/2009 | Oshima et al. | |
| 2012/0242520 A1 | 9/2012 | Noguchi et al. | |
| 2012/0262318 A1* | 10/2012 | Straayer | H03M 1/1057 341/120 |
| 2015/0341044 A1* | 11/2015 | Nakamura | H03M 1/0624 341/118 |
| 2018/0026781 A1* | 1/2018 | Otte | H04L 7/02 |

FOREIGN PATENT DOCUMENTS

| | | |
|---|---|---|
| JP | H04172274 A | 6/1992 |
| JP | 2001208804 A | 8/2001 |
| JP | 2003502979 A | 1/2003 |
| JP | 2009130444 A | 6/2009 |
| WO | 0079684 A | 12/2000 |

OTHER PUBLICATIONS

Jin, H. et al., "Time-Interleaved A/D Converter with Channel Randomization", IEEE International Symposium on Circuits and Systems, Jun. 9-12, 1997, pp. 425-428, Hong Kong.

Liu, W. et al., "600MS/s 30mW 0.13pm CMOS ADC Array Over 60dB SFDR with Adaptive Digital Equalization", Solid-State Circuits Conference—Digest of Technical Papers, Feb. 9, 2009, pp. 82-84.

Tamba, M. et al., "A Method to Improve SFDR with Random Interleaved Sampling Method", ITC International Test Conference, Nov. 1, 2001, pp. 512-520, Baltimore, US.

Dyer, K. et al., "An Analog Background Calibration Technique for Time-Interleaved Analog-to-Digital Converters", IEEE Journal of Solid-State Circuits, vol. 33, No. 12, Dec. 31, 1998, pp. 1912-1919, IEEE.

Fan, Y. "Study on Multi-Channel Time-Interleaved Analog-to-Digital Converter Correction and Integrated Circuit Implementation Method", Wanfang Dissertation Database, Dec. 31, 2012, pp. 1-159. National Intellectual Property Administration, P. R. China Search Report for CN 201580080501.8, dated May 18, 2020, pp. 3-4.

* cited by examiner

TIME-INTERLEAVED ANALOG-TO-DIGITAL CONVERTER SYSTEM

TECHNICAL FIELD

The present disclosure relates to analog-to-digital converter (ADC) systems. The present disclosure also relates to a system and method of error correction in an interleaved ADC array.

BACKGROUND

A bottleneck in many digital systems is the capability to handle large bandwidths, and in particular the capability to analog-to-digital (AD) convert an analog signal having a large bandwidth. One known way to increase the bandwidth of a system is to chop the analog signal into M parallel streams and do the AD-conversion at M times lower rate using M parallelly arranged AD-converters. After the AD-conversion the streams may be concatenated in time to restore the true sample rate. Such a parallel approach is also referred to as time-interleaved AD-conversion. A drawback of a time interleaved system is that each stream may have different characteristics due to component spread in the AD-converters and due to differences in the physical path from a common input port to the respective ADC. Impairments in time, gain, DC offset and nonlinearities may add up independently on each stream and cause distortions when the signal is concatenated.

High bandwidth digital communication systems generally require a high spurious free dynamic range (SFDR) and a low noise floor. The distortions introduced in a time interleaved system may for example lead to a reduction in SFDR.

Some existing methods approach the problem of distortions in a time-interleaved system by calibrating the different streams during manufacturing. However, this only provides a static correction of errors presently in the system, and does not take into account that distortions may change or new errors may arise during operation of the system.

Another approach is to use an adaptive calibration method where one or more (N) streams, and AD-converters, are added and the active AD-converter among the M+N available AD-converters is selected using a randomized pattern. See e.g. Tamba et. al. "A method to improve SFDR with random interleaved sampling method", ITC International Test Conference, 2001, pp. 512-520. The use of a random interleaved sampling method improves the SFDR. However, a problem with the randomized selection of streams is that it converts the distortion to random noise giving a higher noise floor in the system. It is equivalent to a spread spectrum system, i.e. the signal is modulated with a random signal before and after the signal processing block. E.g. a spurious is smeared out in the frequency plane.

The same effect is illustrated by Jin et al., "Time-Interleaved A/D Converter with Channel Randomization" ISCAS'97, Jun. 9-12, 1997, pp. 425-428, where channel randomization in a time-interleaved AD-converter leads to an improved SFDR but also to an elevated noise floor.

In view of the above, it is desirable to provide ADC systems, and in particular time-interleaved AD conversion systems, where the SFDR can be increased without increasing the noise floor.

SUMMARY

In view of above-mentioned and other desired properties of ADC systems, and of time-interleaved ADC systems in particular, it is an object of the present technique to provide improved ADC-systems having improved error correction capabilities, and also to provide methods for error correction in ADC systems.

According to a first aspect, it is provided a time-interleaved analog-to-digital converter (ADC) system comprising an input port configured to receive an analog signal, an ADC-array comprising M, M≥2, ADCs arranged in parallel. Each ADC is configured to receive and to convert a portion of the analog signal into a digital signal at a sample rate $f_s$. The ADC-system further comprises a reference ADC configured to receive and to convert the analog signal into a digital reference signal at an average sampling rate $f_{ref}$ lower than $f_s$. Each sampling instant of the reference ADC corresponds to a sampling instant of an ADC in the array of ADCs, and the ADC to select for each reference ADC sampling instant is randomized over time. The ADC-system also comprises a correction module configured to adjust the digital signal outputs of the ADC-array into a corrected digital output signal based on samples of the digital reference signal and the digital signals from the corresponding selected ADCs.

The technique disclosed herein is based on a realization that with a correction event which is randomized over time it is possible to remove the mean residual error and to improve, e.g., the spurious free dynamic range (SFDR) with minimal degradation of the signal-to-noise ratio (SNR).

According to some aspects, the ADC to select for each reference ADC sampling instant is based on a pseudo-random pattern.

According to some further aspects the pseudo-random pattern is a predetermined pattern.

According to some aspects the correction module is configured to be updated using a feedback error calculated as the difference between the output signal and the reference signal.

According to some aspects, the sampling rate $f_s$ is defined as $f_s=F/M$, F being a system clock frequency.

According to some further aspects, the system further comprises a time delay module configured to reduce the system clock rate M times giving $f_s=F/M$ and to delay consecutive sampling events for the ADC-array by $t_D=1/(f_s*M)$.

According to some aspects, the system further comprises a reference ADC clock control module configured to control the sampling instants of the reference ADC. The reference ADC clock control module is further configured to select the ADC to sample based on an offset time $t_{offset}=D/(f_s*M)$ added to the fundamental period $1/f_s$ such that the period between two consecutive sample events for the reference ADC is $1/f_s+D/(f_s*M)$. A sampling phase is defined as M consecutive sampling events of the ADCs. D is a random integer D=0 ... (M-1).

According to some aspects, D is generated from a pseudo-random binary sequence.

According to some aspects, the reference ADC is undersampled by a factor R, R being a positive integer R≥1, such that an average undersampled sampling rate $f_{refU}$ is determined as $f_{refU}=f_{ref}/R$, such that the period between two consecutive sample events for the reference ADC is given by $R/f_s+D/(f_s*M)$, where D is a random integer D=0 ... (M-1).

According to some aspects, the correction module is configured to correct a DC error, a gain offset error, a time offset error and/or a nonlinearity error.

According to some aspects, the correction module comprises M correction blocks (304 a-d), each correction block corresponding to a respective ADC of the ADC-array.

According to some further aspects, the time-interleaved analog-to-digital converter (ADC) system comprises an input port configured to receive an analog signal, an ADC-array comprising M, M≥2, ADCs arranged in parallel. Each ADC is configured to receive and to convert a portion of the analog signal into a digital signal at a sample rate $f_s$. The ADC-system further comprises a sample clock module having a sampling frequency $f_s=F/M$, F being the system clock, wherein consecutive sampling events for the ADCs are delayed by $t_D=1/(f_s*M)$. The ADC system further comprises a first multiplexer connected to each of the ADCs and configured to concatenate output signals from said ADCs into a single data stream, a reference ADC configured to receive and to convert the analog signal into a digital reference signal at an average sampling rate $f_{ref}$ lower than $f_s$, wherein each sampling instant of the reference ADC corresponds to a sampling instant of an ADC in the array of ADCs, and wherein the ADC to select for each reference ADC sampling instant is randomized over time. Moreover, the ADC system comprises a reference ADC clock control module configured to control the sampling instants of the reference ADC, and a correction module connected to the first multiplexer to receive said data stream. The correction module comprises M correction blocks, each correction block being configured to correct a portion of the data stream AD-converted by a corresponding ADC, wherein an output signal from the reference ADC is provided to the error correction block configured to correct the portion of the data stream from the ADC from which the reference ADC sampling instant is selected. The ADC system also comprises a second multiplexer connected to an output of each of the correction blocks and configured to combine output signals from each of the error correction blocks to provide an ADC-system output signal.

The object stated above is also obtained by a method for analog-to-digital (AD) conversion in a system comprising a time-interleaved analog-to-digital converter (ADC) having an ADC-array comprising M, M≥2, ADCs arranged in parallel. The method comprises receiving an analog signal, AD-converting the signal by means of the ADC-array using a sampling rate $f_s$. In a reference ADC the analog signal is converted into a digital reference signal at an average sampling rate $f_{ref}$ lower than $f_s$, where each sampling instant of the reference ADC corresponds to a sampling instant of an ADC in the array of ADCs, and wherein the ADC to select for each reference ADC sampling instant is randomized over time. Furthermore, the method comprises adjusting the digital signal outputs of the array of ADCs into a corrected digital output signal based on samples of the digital reference signal and the digital signals from the corresponding selected ADCs.

According to some aspects, the ADC to select for each reference ADC sampling instant is based on a pseudo-random pattern.

According to some aspects, the pseudo-random pattern is a predetermined pattern.

According to some further aspects, the method further comprises updating the correction module using a feedback error calculated as the difference between the output signal and the reference signal.

According to some aspects the sampling rate $f_s$ is defined as $f_s=F/M$, with F being a system clock frequency.

According to some aspects, the method further comprises delaying consecutive sampling events for the ADC array by $t_D=1/(fs*M)$.

According to some aspects, the method further comprises selecting the ADC to sample based on an offset time $t_{offset}=D/(f_s*M)$ added to the fundamental period $1/f_s$ such that the period between two consecutive sample events are $1/f_s+D/(f_s*M)$, where D is a random integer D=0 ... (M−1).

According to some aspects, the method further comprises generating D based on a pseudo-random binary sequence.

According to some aspects, the method further comprises correcting a DC error, gain offset error, time offset error and/or a nonlinearity error.

The object stated above is further obtained by a time-interleaved analog-to-digital converter (ADC) module comprising an input port for to receiving an analog signal an ADC-array module for analog-to-digital conversion of the signal at a sampling rate $f_s$ a reference ADC module for converting the analog signal into a digital reference signal at an average sampling rate $f_{ref}$ lower than fs. Each sampling instant of the reference ADC corresponds to a sampling instant of an ADC in the array of ADCs, and the ADC to select for each reference ADC sampling instant is randomized over time. The ADC-module further comprises a correction module for adjusting the digital signal outputs of the array of ADCs into a corrected digital output signal based on samples of the digital reference signal and the digital signals from the corresponding selected ADCs.

In addition, there is disclosed herein an analog-to-digital converter (ADC) system comprising an input port configured to receive an analog signal and an ADC-array comprising a single ADC, M=1, configured to receive and to convert the analog signal into a digital signal at a sample rate $f_s$. The ADC system further comprises a reference ADC configured to receive and to convert the analog signal into a digital reference signal at an average sampling rate $f_{ref}$ lower than $f_s$, wherein each sampling instant of the reference ADC corresponds to a sampling instant of the single ADC, and wherein the sampling instants of the reference ADC are randomized over time, and a correction module configured to adjust the digital signal output of the single ADC into a corrected digital output signal based on samples of the digital reference signal and on corresponding samples from the single ADC.

The technique disclosed herein relating to an ADC system comprising a single ADC is based on a realization that with a correction event which is randomized over time it is possible to remove the mean residual error and to improve, e.g., the spurious free dynamic range (SFDR) without degrading the signal-to-noise ratio (SNR).

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated. Further features of, and advantages with, the present technique will become apparent when studying the appended claims and the following description. The skilled person realize that different features of the present technique may be combined to create embodiments other than those described in the following, without departing from the scope of the present technique.

BRIEF DESCRIPTION OF THE DRAWINGS

The present technique is now described, by way of example, with reference to the accompanying drawings, in which.

DETAILED DESCRIPTION

The present technique will now be described more fully hereinafter with reference to the accompanying drawings, in which certain embodiments of the present technique are shown. The present technique may, however, be embodied in many different forms and should not be construed as limited to the embodiments set forth herein; rather, these embodiments are provided by way of example so that this disclosure will be thorough and complete, and will fully convey the scope of the technique to those skilled in the art. Like numbers refer to like elements throughout the description.

In the following detailed description, various embodiments of the analog-to-digital converter system (ADC system) are mainly described with reference to a time-interleaved ADC system comprising four ADCs arranged in parallel to form an ADC array. It should be understood that the principle of the present technique is applicable to an ADC system comprising any number of ADCS. In particular, as discussed below in connection to FIG. 10, variants of the present technique is applicable also in the special case of an ADC-array comprising only a single ADC.

Figure 1:
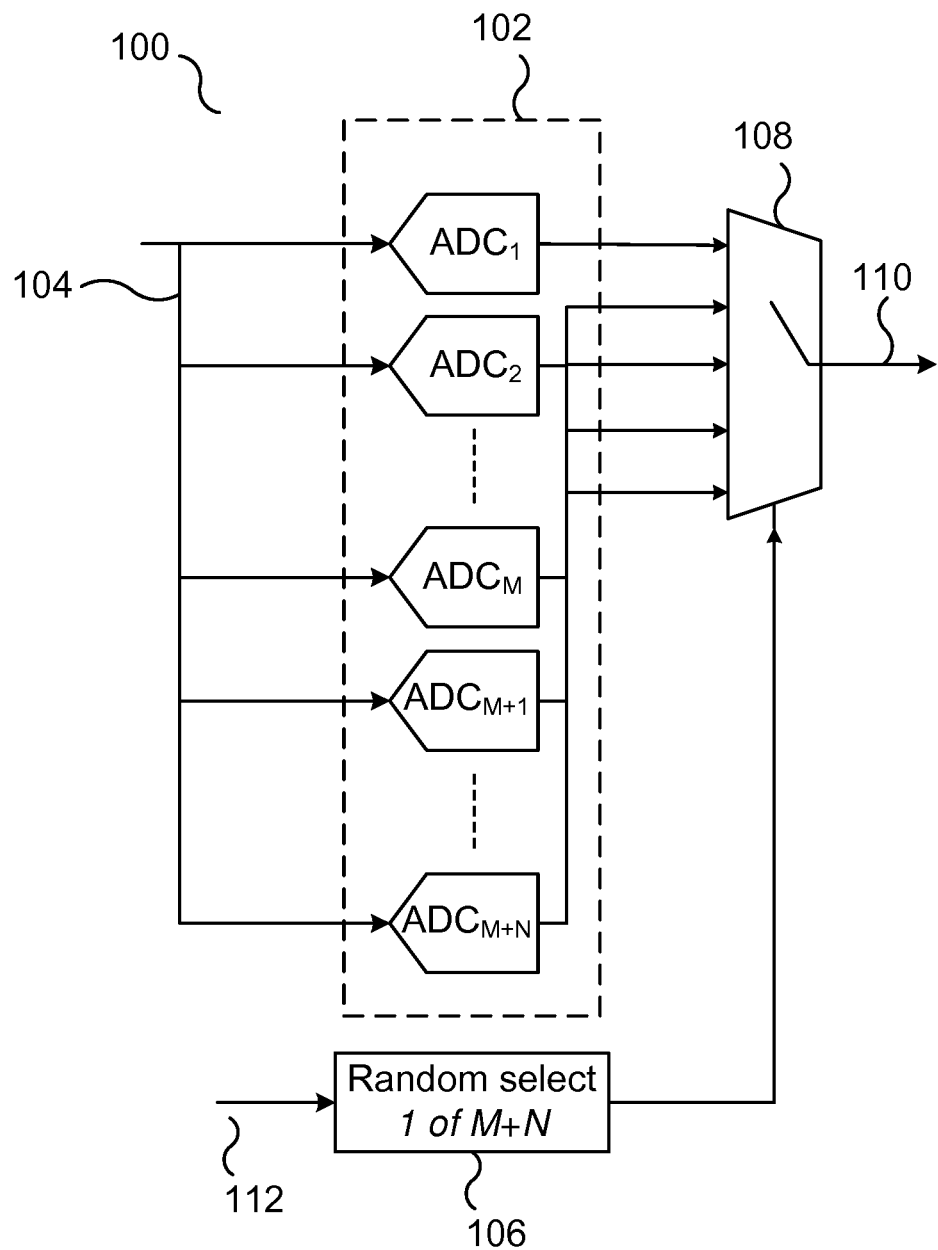
FIG. 1 (prior art) is a schematic illustration of a prior art time-interleaved ADC system.

FIG. 1 schematically illustrates a prior art time-interleaved ADC system 100 comprising an ADC-array 102 composed of M+N ADCs arranged in parallel. An input signal 104 is connected to each of the ADCs of the ADC-array 102. A random selection block 106 is connected to a multiplexer 108 to randomly select the output signal from one of the M+N ADCs, the selected ADC being denoted as active ADC, to form a resulting output signal 110. The random selection block is controlled by the system clock 112 and the sampling rate of the ADC array is the system clock divided by M, meaning that the sampling rate for each individual ADC in the ADC-array $f_s$, is equal to the system clock frequency F, divided by M, i.e. $f_s$=F/M.

The described prior art ADC system 100 addresses the problem that each stream may have different characteristics due to component spread, which introduces distortion in the resulting output signal 110, by adding one or more (N≥1) streams and selecting the active ADC among the M+N ADCs arranged in parallel using a randomized pattern. However, a problem with this randomized selection of streams is that it converts the above-mentioned distortion to random noise giving a higher noise floor in the system. This effect will be further discussed below in connection to FIG. 7. The principle underlying the prior art ADC system 100 shown in FIG. 1 is similar to that of a spread spectrum system, such as a code-division-multiple-access (CDMA) communication system, i.e. the signal is modulated, or spread, by a random signal before and after a signal processing block, resulting in that e.g. a spurious emission of the ADC system is smeared out in the frequency plane. This effect will be further discussed below in connection to FIG. 7.

It is appreciated that, when discussing frequencies, production spread and tolerance levels may give rise to slight discrepancies between frequencies in an implementation and frequencies as defined herein. Thus a frequency f, although defined as f=F/M is not necessarily exactly equal to F/M in an implementation.

Figure 2:
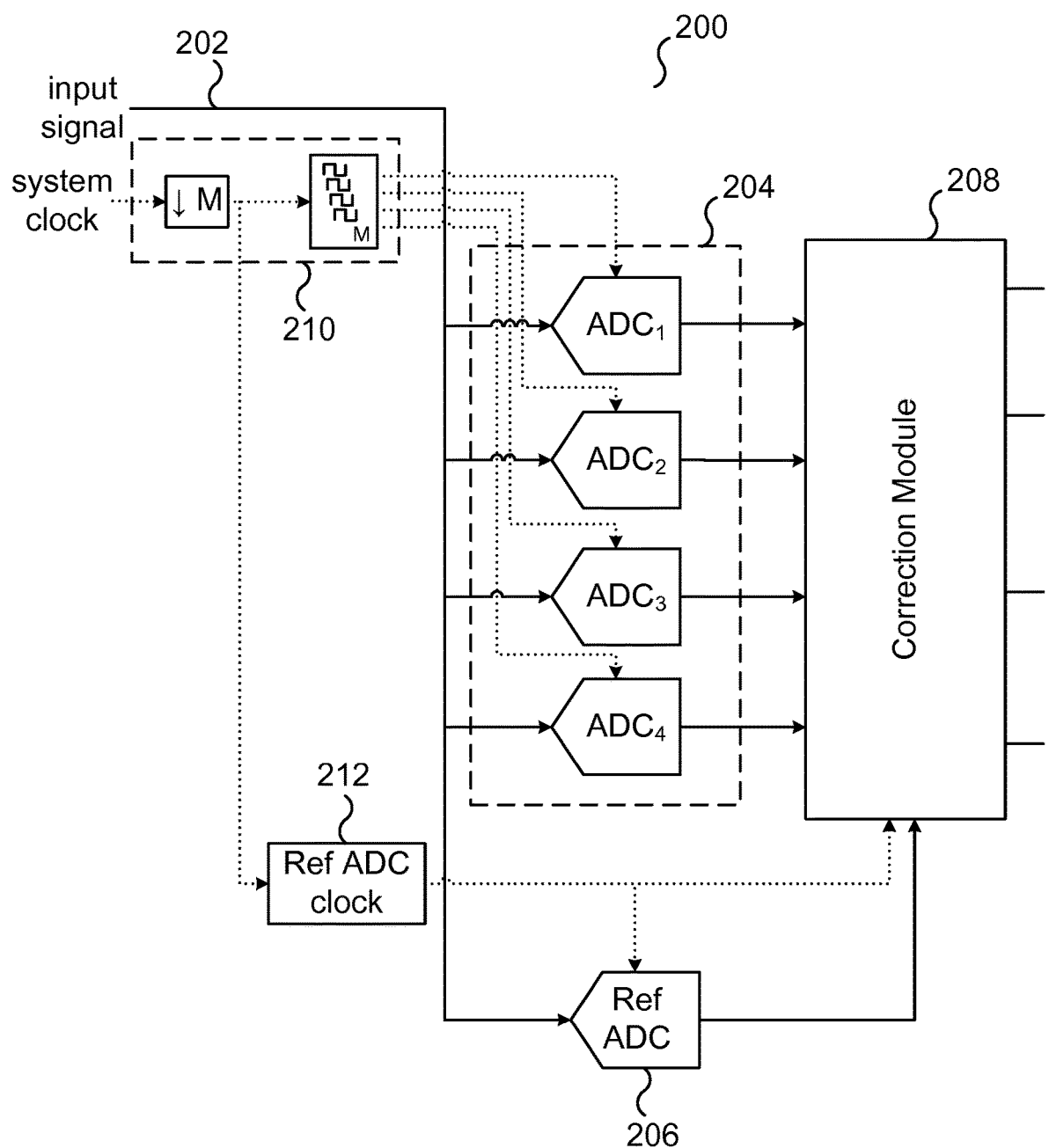
FIG. 2 is a schematic illustration of a time-interleaved ADC system according to an embodiment of the present technique.

FIG. 2 schematically illustrates an ADC system 200 according to an embodiment of the present technique. The ADC system 200 comprises an input port 202 configured to receive an analog input signal. The input port 202 is connected to each ADC in an ADC-array 204. Here, four ADCs ($ADC_1$-$ADC_4$) are illustrated, i.e. M=4. The sampling of the ADCs in the ADC-array is controlled by a time delay module 210 configured to reduce the system clock rate F M times giving fs=F/M and to delay consecutive sampling events for the ADCs as will be discussed in further detail in relation to FIG. 4. The M times down-sampled system clock is also coupled to a reference ADC 206 which is controlled by a reference ADC clock module 212. The output of each ADC of the ADC-array 204, as well as the output of the reference ADC 206, is connected to a correction module 208.

The reference ADC 206 is configured to receive and to convert the analog input signal into a digital reference signal at an average sampling rate $f_{ref}$ which is lower than $f_s$, wherein each sampling instant of the reference ADC 206 corresponds to a sampling instant of an ADC in the ADC-array 204. In particular, the general principle of the present technique lies in the randomized selection of the sample time of the reference ADC 206. In the embodiment of FIG. 2, if $f_{ref}$ was to be equal to $f_s$, the same ADC would be sampled for each sampling event and there would be no randomization to the selection of the ADC to sample, as will be elaborated in further detail in relation to FIG. 4. Moreover, it should be noted that $f_{ref}$ is the average sampling frequency for the reference ADC, determined over a large number of sampling events. The correction module 208 is configured to adjust the digital signal outputs of each of the ADCs of the ADC-array 204 into a corresponding corrected digital output signal for each ADC based on samples of the digital reference signal and the digital signals from the corresponding selected ADC.

Figure 3:
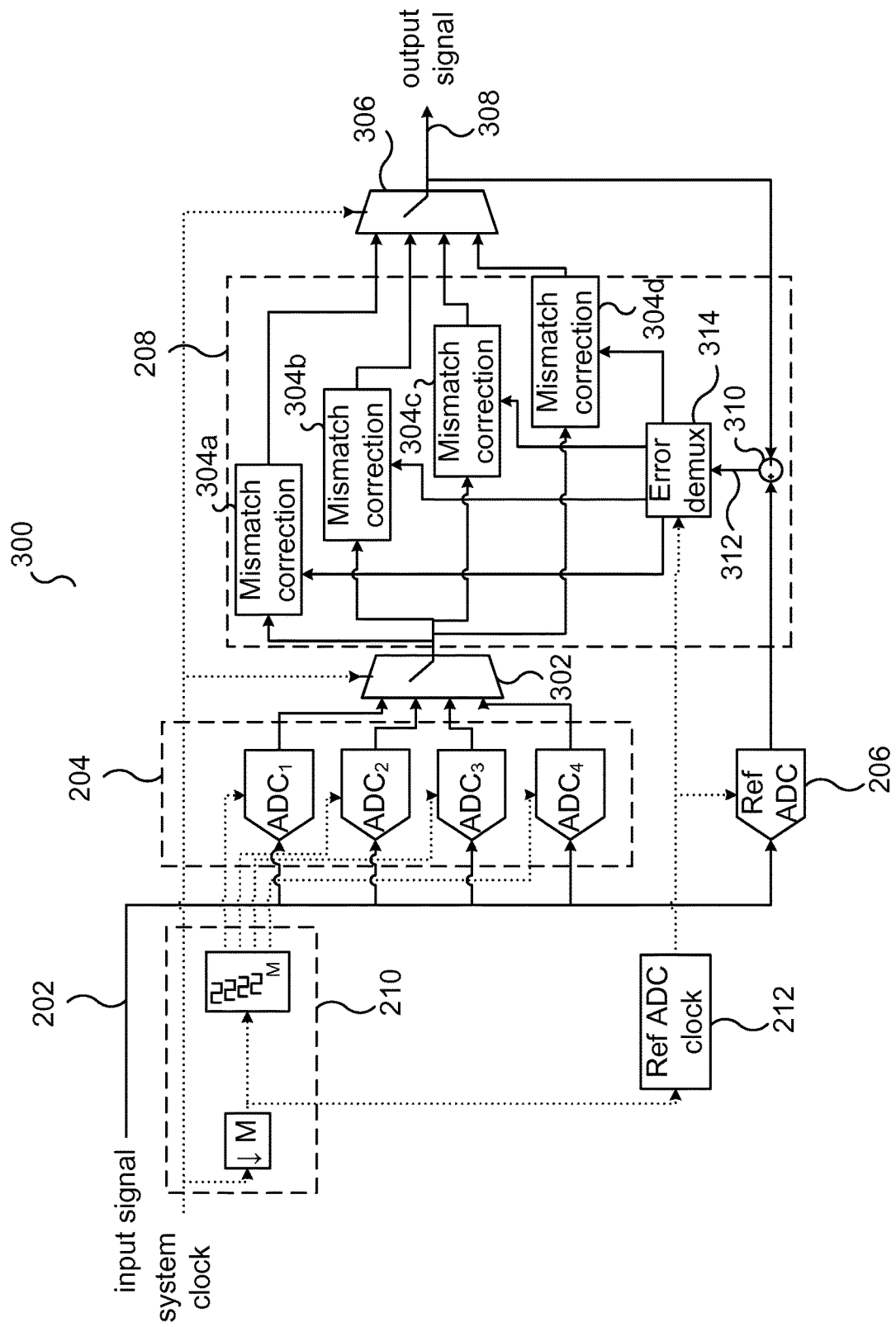
FIG. 3 is a schematic illustration of a time-interleaved ADC system according to an embodiment of the present technique.

FIG. 3 schematically illustrates an ADC system 300 according to an embodiment of the present technique. In addition to the features described with reference to FIG. 2, FIG. 3 further illustrates that the digital output signals from the ADC-array 204, i.e. the data streams, are connected to a first multiplexer (MUX) 302 which in turn is connected to a corresponding one of the M mismatch correction blocks 304a-d in the correction module 208. The first multiplexer 302 couples the output signals from the ADCs to the corresponding mismatch correction block in the order 1, 2 . . . M. The outputs from the mismatch correction blocks 304a-d are in turn connected to a second multiplexer 306 for concatenating the corrected data streams, in the same order as before (1, 2 . . . M), into a single output signal 308. The first and second multiplexer may also be referred to as a first and second serializer.

Moreover, FIG. 3 illustrates that the reference sample is used to calculate the error of the output signal with respect to the digital reference signal. In particular, the output from the reference ADC 206 is connected to a subtractor 310 forming an output signal, which can be referred to as an error signal 312, as the difference between the output signal from the reference ADC 206 and the output signal 308 from the second multiplexer 306, where the resulting error signal 312 is connected to an error demultiplexer 314. The error demultiplexer 314 couples the error signal 312 from the subtractor 310 to the mismatch correction block corresponding to the ADC for which the reference ADC 206 was sampled. As an example, if the reference ADC 206 was sampled at the same sampling instant as $ADC_2$, the error multiplexer 314 couples the error signal 312 to mismatch correction block 304b. The error signal 312 is used to update the correction algorithm of the corresponding mismatch correction block. Accordingly, the described error correction block 208 comprises adaptive mismatch correction blocks 304a-d.

It is appreciated that the type of error signal used in FIG. 3 only serves as an example. Many different types of error signals can be used with the same or similar technical effect. For instance, reversing polarity of the subtractor 310, or taking logarithms of the difference, or absolute value of the difference, or squared difference, may be applicable depending on the type of mismatch correction implemented.

The proposed technique keeps the M different time-interleaved data-streams from the ADC-array 204 in a sequential selection scheme after AD-conversion. The order of the selected data streams in the first multiplexer 302 are 1, 2, . . . M, 1, 2, . . . M etc. An under-sampled time-randomized clock is used to trigger the reference ADC 206 sample event to sample a reference value used in the correction of the corresponding digital stream. The time-randomization sequence preferably has as white spectrum characteristics as possible, i.e. the autocorrelation for the signal is preferably as low as possible for lags different than zero. A pseudo-random signal pattern may be used and the selected periodicity of the pattern will be dependent on the total sequence length of the signal pattern.

The reference sample from the reference ADC 206 is used to calculate the feedback error from the output signal. The feedback error is evaluated in the branch with the same phase state as the reference had at the sample event. The error is used for updating one or more mismatch correction blocks in the system. The mismatch correction block operates at the system sample clock frequency F, i.e. sample clock $f_s$ times M. With a randomized correction event it is possible to significantly reduce or even totally remove the mean residual error without degrading the signal-to-noise ratio (SNR), as will be further illustrated below.

Figure 4:
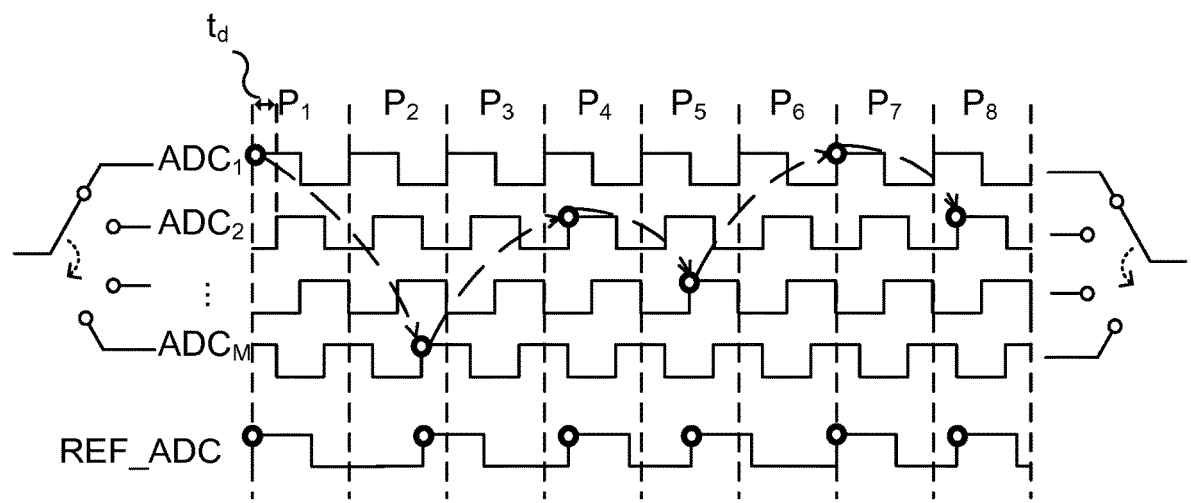
FIG. 4 is a clock timing diagram schematically illustrating a sampling principle of an embodiment of the present technique.

FIG. 4 is a clock diagram outlining a general principle of the present technique. Herein, it is assumed that signals are always sampled on the positive flank of the clock signal, i.e., as the clock signal goes high. First, it is assumed that the system works at a system clock frequency F. Each consecutive ADC of the ADC array is sampled at a sample rate $f_s$ with a delay $t_d$ of 1/F from the sampling of the previous ADC, the effective sampling frequency of each ADC thus being $f_s$=F/M. Accordingly, the time delay module 210 is configured to delay each consecutive sampling event by $t_D$=1/($f_s$*M)=1/F.

With reference to FIG. 4, each of the sampling phases, $P_1$-$P_8$, is defined as M consecutive sampling events (when all of the ADCs of the ADC-array have been sampled once, the phase is completed). Also from FIG. 4, it can be seen that the reference ADC 206 is under-sampled in comparison to each ADC of the ADC array, meaning that the average sampling rate of the reference ADC, $f_{ref}$, is lower than $f_s$. Note, for instance, that no reference sample is taken in sampling phase $P_3$.

In order for the reference ADC 206 to properly sample the same portion of the input signal as the selected ADC, for each selected ADC, no period of the reference ADC 206 can be shorter than the period of the ADCs of the ADC array, i.e. 1/$f_s$. In other words, the period of the reference ADC cannot be shorter than the ADC-period. Thus, the reference ADC is under-sampled compared to the sample rate of the ADCs. The same holds true for the special case of an ADC array having only a single ADC, which will be discussed below in connection to FIG. 10.

Figure 5:
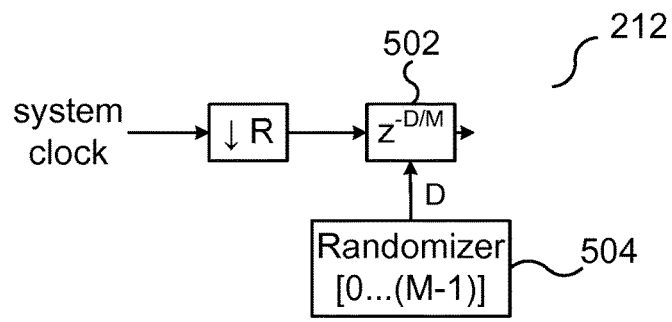
FIG. 5 is a schematic illustration of a clock control block comprised in an embodiment of the present technique.

FIG. 5 is a schematic illustration of a clock control block 212 for a reference ADC used in ADC-arrays with more than one ADC, i.e., where M≥2. The clock control block shown in FIG. 5 can further reduce the sampling rate $f_{ref}$ by a factor R, R≥1, and adds a random time offset to select which branch to be updated. The random time offset is represented by offset block 502 and the offset $Z^{-D/M}$ where D=0 . . . (M−1), giving the offset time $t_{offset}$=D/($f_s$*M) added to the fundamental period R/$f_s$ such that the period between two consecutive sample events is R/$f_s$+D/($f_s$*M). The term $Z^{-D/M}$ in the offset block 502 represents the Z-transform of a delay, where $Z^{-1}$ represents the Z-transform of a unit delay. The randomizer 504 may also provide a suitable random, pseudo-random or pre-determined pseudo-random sequence for D, and a pseudo-random sequence can for example be a pseudo-random binary sequence (PRBS). Various pseudo-random binary sequences are known within the field of telecommunication, such as PRBS7, PRBS15, PRBS23 and PRBS31. The signal pattern based on the randomized sequence should have a probability distribution which is substantially uniform over a large number of selections, i.e. not just over one period.

The random clock control shown in FIG. 5 block is thus, at least according to some aspects where M≥2, used to generate the sample event for the reference ADC 206. Each reference sample event has a period lower than or equal to R/fs and adds a random time offset in the range D/(fs*M), D=0 . . . (M−1), to spread the selection evenly between the M ADCs. The sample rate for the reference ADC 206 may be made lower by selecting R>1, giving a more under-sampled system with the average undersampled sampling rate $f_{refU}$ determined as $f_{refU}$=$f_{ref}$/R. The random offset $t_{offset}$ thus becomes $t_{offset}$=R*D/(fs*M). However, the offset $t_{offset}$ still needs to be aligned to a 1/(fs/M)=1/F resolution. Selecting a higher value for R would lead to a more under-sampled system. Furthermore, the reference ADC could be time-sliced so that it could be used for other ADC-arrays when it is not used for the present ADC-array. In a practical application, R can for example be selected as 1<R<10. Also, a lower clock rate gives a lower energy consumption. Moreover, it is desirable that the reference ADC 206 has a higher time accuracy compared to the ADCs of the ADC array 204 and the reference ADC 206 should preferably also have a higher linearity. A reference ADC 206 having such improved properties is more easily achieved if the reference ADC 206 is allowed to sample at a lower rate than the ADCs of the ADC array 204.

Again with reference to FIG. 4, it can be seen that the sequence of selected ADCs determines if a reference sample is taken for each phase or not. With reference to the example in FIG. 4 assuming M=4, the illustrated sequence of D is 0, 3, 1, 2, 0, 1. The sequence of ADCs to select together with the condition that the sample period of the reference ADC must be longer than or equal to the sample period of the ADCs determines in which phases the selected ADCs are sampled. In $P_1$, D is equal to zero meaning that there is no offset from the start of the phase and $ADC_{ref}$ is sampled simultaneously with $ADC_1$ at the start of $P_1$. Next, in $P_2$, D=3, giving an offset time of 3/(fs*4)=3/F from the start of $P_2$, such that $ADC_4$ is sampled. In $P_3$, D=1, meaning that $ADC_2$ is selected to be sampled. However, $ADC_2$ cannot be sampled in $P_3$ while maintaining the condition that the period of the sampling of $ADC_{ref}$ is longer than or equal to the period of the ADCs. Accordingly, no sample for $ADC_{ref}$ is acquired in $P_3$ and $ADC_2$ is instead sampled in $P_4$. In summary, consecutive ADCs can only be sampled in consecutive phases if D for the second ADC is larger than or equal to D for the first ADC. As can be seen from FIG. 4, the random nature of the selection sequence thus ensures that $f_{ref} < f_s$.

Figure 6:
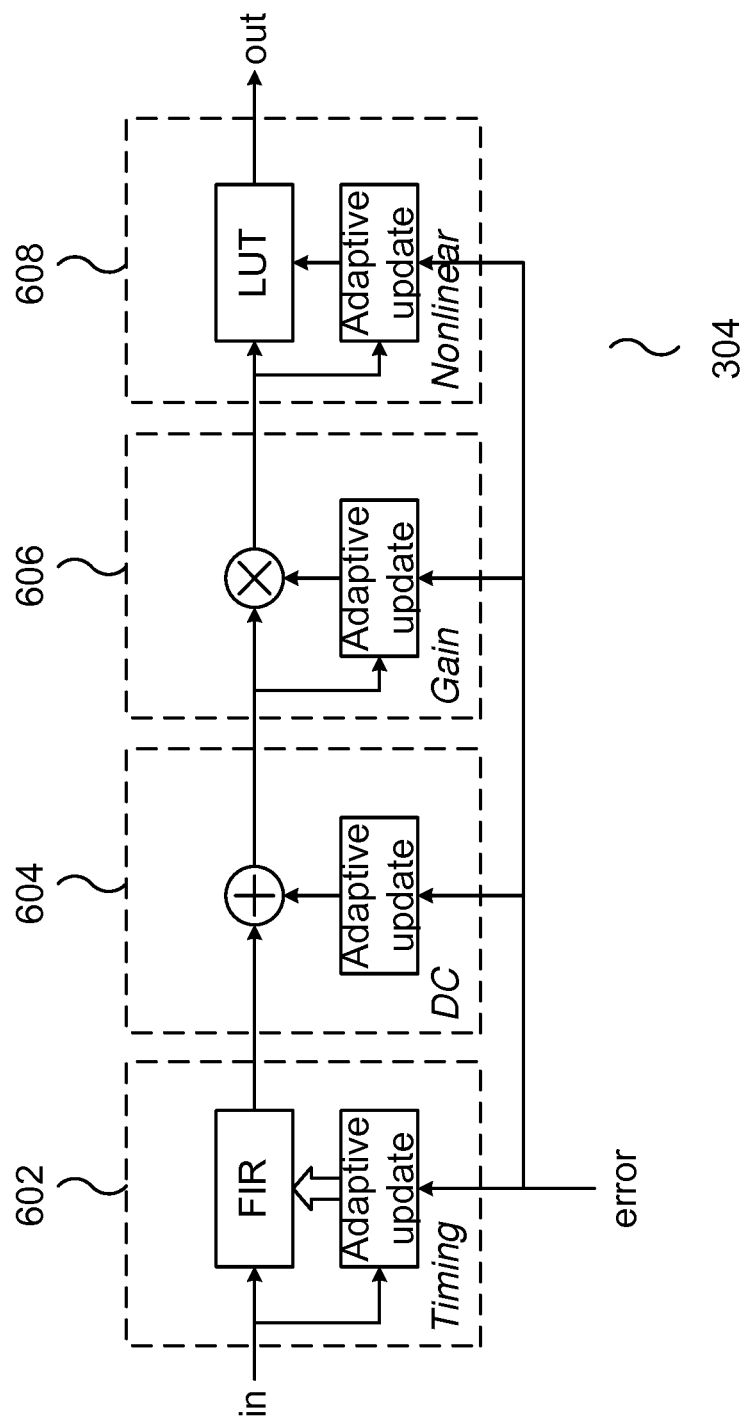
FIG. 6 is a schematic illustration of an error correction block comprised in an embodiment of the present technique.

FIG. 6 is a schematic illustration of a mismatch correction block 304 which compensates for different errors in the system, such as the mismatch correction blocks shown in FIG. 3. FIG. 6 shows an example mismatch correction block where first a timing error is corrected 602, followed by DC correction 604, gain correction 606, and finally correction for nonlinearities 608. Each correction step is adaptive, taking the error signal 312 as an input signal for adapting the correction algorithm. However, the order in which the corrections are applied depends upon how the errors are introduced in the hardware. Moreover, the adaptive update is block-based since the reference ADC 206 is under-sampled, and the under-sampling factor affects the convergence speed of the adaptive blocks in the system. Accordingly, a larger under-sampling factor R reduces the convergence speed of the adaptive blocks. Mismatch correction blocks comprising only a subset of timing error correction 602, DC correction 604, gain correction 606, and correction for nonlinearities 608 are of course also possible to use in an ADC system according to the present technique.

Figure 7:
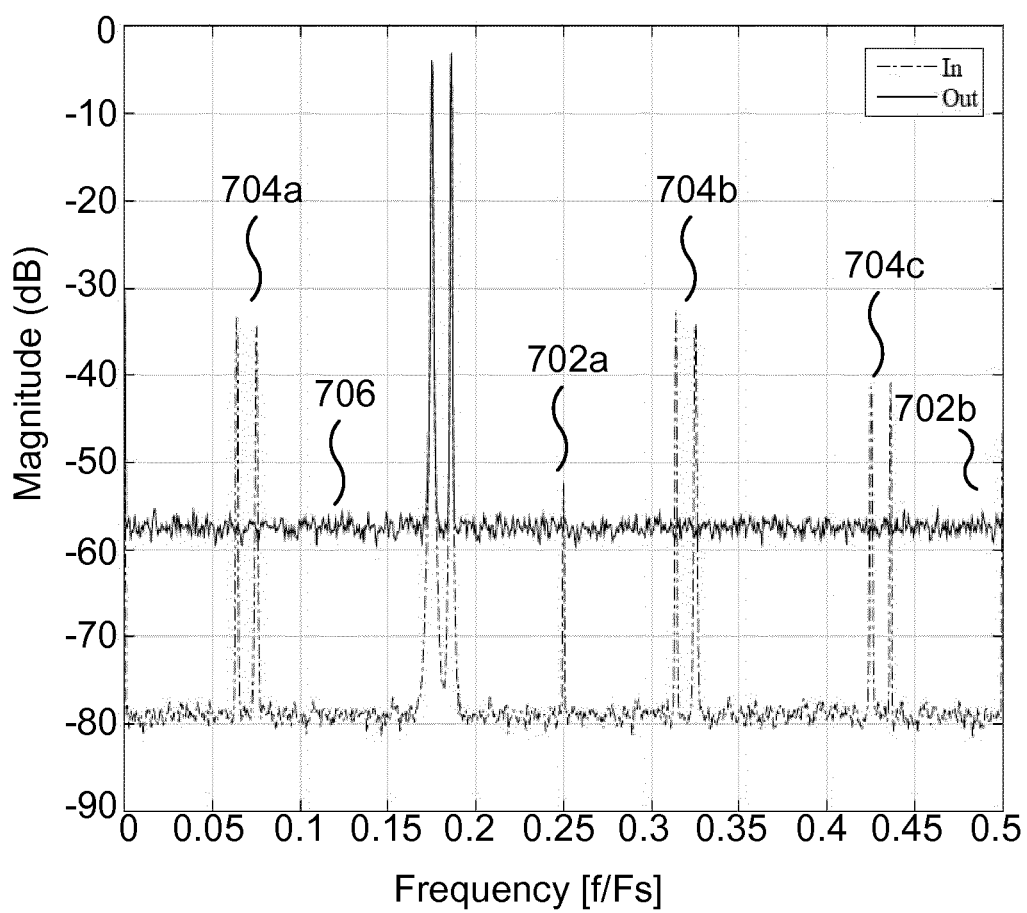
FIG. 7 (prior art) is a graph schematically illustrating input and output signals for a prior art time-interleaved ADC system.

FIG. 7 is a diagram schematically outlining a computer simulation of the input signal and output signal of the prior-art interleaved ADC-array illustrated in FIG. 1 using an algorithm with randomized selection of data streams. The input signal shows peaks corresponding to DC-offset 702*a-b* and to gain and time offset 704*a-c*. The increased noise floor 706 seen in the output signal is generated by the spectrum spread of the impairment peaks, as discussed above in connection to FIG. 1. This algorithm improves the SFDR with ~25 dB but also degrades the SNR with ~20 dB compared to an ideally AD-converted signal.

Figure 8:
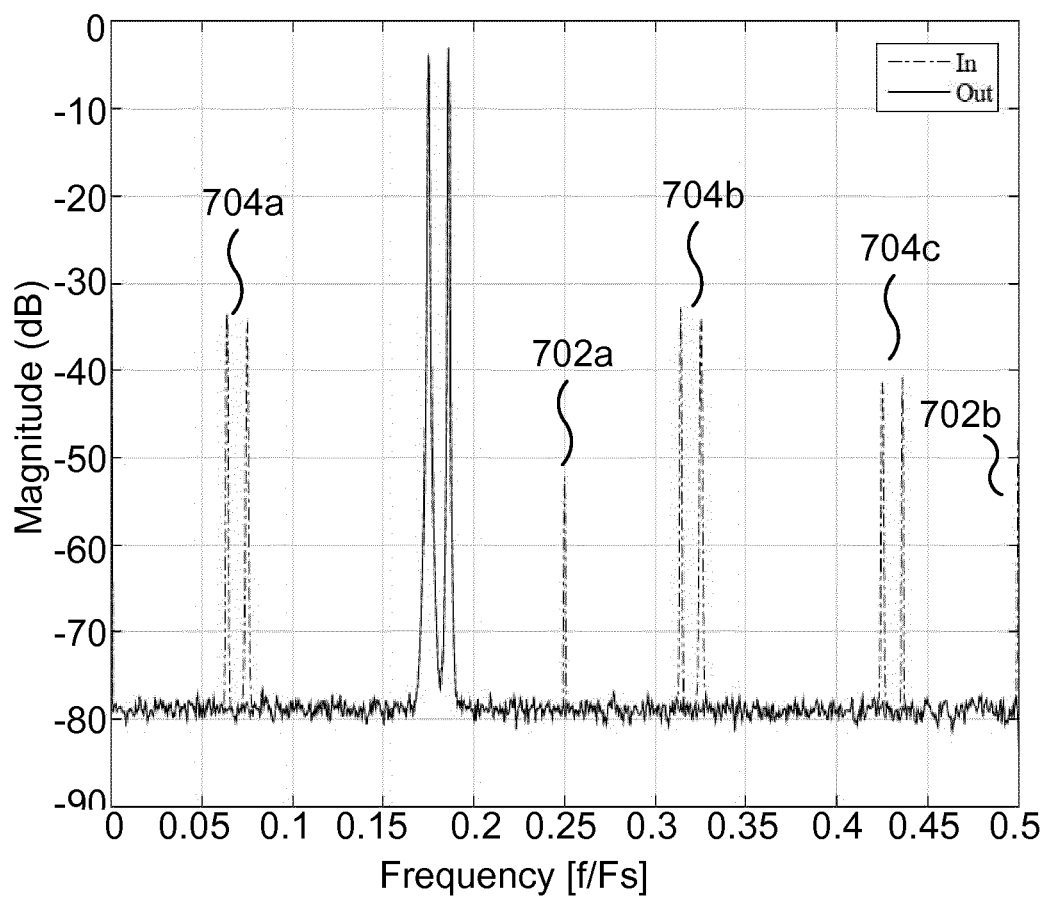
FIG. 8 is a graph schematically illustrating input and output signals for a time-interleaved ADC system according to an embodiment of the present technique.

FIG. 8 is a diagram schematically outlining a computer simulation of the input signal and output signal of an ADC system 200, 300 according to the present technique with a randomized sampling of the reference ADC. As can be seen, the input signal of FIG. 8 is identical to the input signal of FIG. 7, comprising the same error peaks 702*a-b* and 704*a-c*. The present example relates to a two-tone signal and four interleaved ADCs. From the output signal it can be seen that the error peaks have been effectively removed, improving the SFDR without degrading the SNR.

Figure 9:
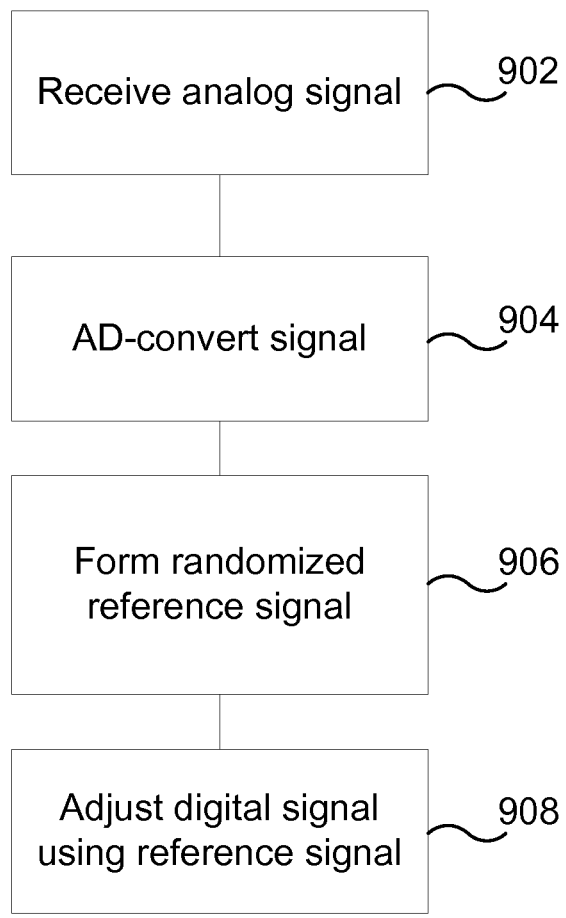
FIG. 9 is a flow-chart outlining the general features of a method according to an embodiment of the present technique.

FIG. 9 is a flow-chart outlining the general method steps according to an aspect of the present technique. First, an analog signal is received 902 by the time interleaved ADC-system 200. Next, the received signal is AD-converted 904 by the time interleaved ADC-array 204. The randomized reference signal is formed 906 and used to adjust the digital signal 908 using the sampled reference signal.

Figure 10:
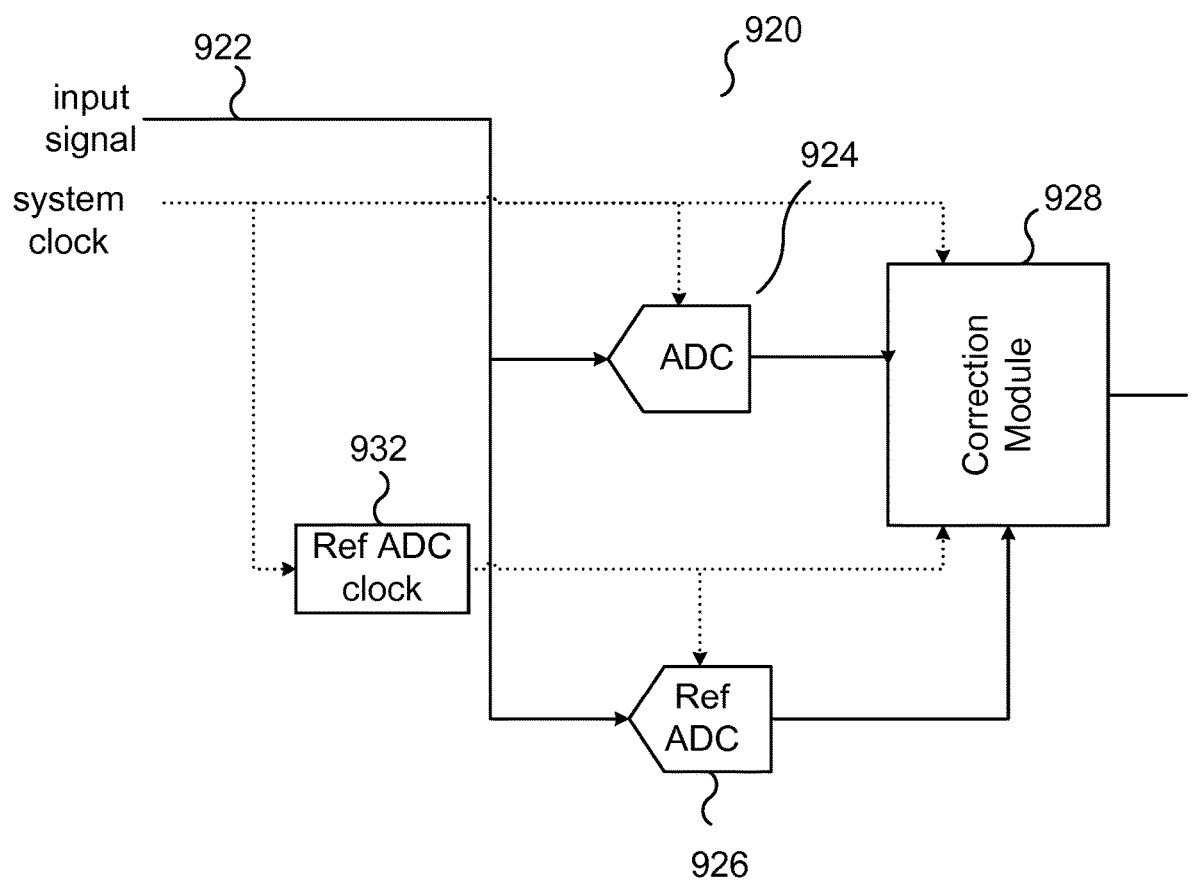
FIG. 10 is a schematic illustration of the special case of an ADC array having a single ADC according to an embodiment of the present technique.

FIG. 10 is a schematic illustration of the special case of an ADC system 920 comprising an ADC array having a single ADC 920 according to an embodiment of the present technique, i.e., where M=1. It has been realized that the techniques described above in relation to ADC-arrays having more than one ADC, i.e., where M≥2, is applicable also in the case of a single ADC system. In a similar manner as discussed above in relation to the ADC-system comprising a plurality of ADCs, the ADC-system illustrated in FIG. 10 comprises an input port 922 configured to receive an analog input signal. The input port 922 is connected to the ADC 924 and to a reference ADC 926. which is controlled by a reference ADC clock module 932. The output of the ADC 924, as well as the output of the reference ADC 926, is connected to a correction module 928. The reference ADC 926 is configured to receive and to convert the analog input signal into a digital reference signal at an average sampling rate $f_{ref}$ which is lower than $f_s$, wherein each sampling instant of the reference ADC 926 is randomized in time, meaning that the intervals between samples (and correction updates) are uncorrelated. Each sampling instant of the reference ADC 932 corresponds to a sampling instant of the ADC 924, meaning that the intervals between samples by the reference ADC 926 are aligned to a 1/F resolution.

Even though the present technique has been described with reference to specific exemplifying embodiments thereof, many different alterations, modifications and the like will become apparent for those skilled in the art from a study of the drawings, the disclosure, and the appended claims. Additionally, variations to the disclosed embodiments can be understood and effected by the skilled person in practicing the present technique.

The invention claimed is:

1. A time-interleaved analog-to-digital converter (ADC) system, comprising:
    an input port configured to receive an analog signal;
    an ADC-array comprising M ADCs arranged in parallel, each ADC being configured to receive and to convert a portion of the analog signal into a digital signal at a sample rate $f_s$, where M≥2;
    a reference ADC configured to receive and to convert the analog signal into a digital reference signal at an average sampling rate $f_{ref}$ lower than $f_s$, wherein each sampling instant of the reference ADC corresponds to a sampling instant of an ADC in the array of ADCs, and wherein the ADC to select for each reference ADC sampling instant is randomized over time;
    a correction module configured to adjust the digital signal outputs of the ADC-array into a corrected digital output signal based on samples of the digital reference signal and the digital signals from the corresponding selected ADCs; and
    a reference ADC clock control module configured to:
        control the sampling instants of the reference ADC;
        select the ADC to sample based on an offset time toffset=D/(fs*M) added to the fundamental period $1/f_s$ such that the period between two consecutive sample events for the reference ADC is $1/f_s + D/(f_s*M)$, where D is a random integer D=0 . . . (M−1).

2. The system of claim 1, wherein the ADC to select for each reference ADC sampling instant is based on a pseudo-random pattern.

3. The system of claim 2, wherein the pseudo-random pattern is a predetermined pattern.

4. The system of claim 1, wherein the correction module is configured to be updated using a feedback error calculated as the difference between the output signal and the reference signal.

5. The system of claim 1, wherein the sampling rate fs is defined as fs=F/M, where F is a system clock frequency.

6. The system of claim 5, further comprising a time delay module configured to:
reduce the system clock rate M times giving fs=F/M; and
delay consecutive sampling events for the ADC-array by $t_D=1/(f_s*M)$.

7. The system of claim 1, wherein D is generated from a pseudo-random binary sequence.

8. The system of claim 1, wherein the reference ADC is undersampled by a factor R, R being a positive integer R≥1, such that an average undersampled sampling rate $f_{ref U}$ is determined as $f_{ref U}=f_{ref}/R$, such that the period between two consecutive sample events for the reference ADC is given by $R/f_s+D/(f_s*M)$, where D is a random integer D=0 . . . (M−1).

9. The system of claim 1, wherein the correction module is configured to correct at least one of a DC error, a gain offset error, a time offset error, and a nonlinearity error.

10. The system of claim 1, wherein the correction module comprises M correction blocks, each correction block corresponding to a respective ADC of the ADC-array.

11. A time-interleaved analog-to-digital converter (ADC) system, comprising;
an input port configured to receive an analog signal;
an ADC-array comprising M ADCs arranged in parallel, each ADC being configured to receive and to convert a portion of the analog signal into a digital signal at a sample rate fs; where M≥2;
a sample clock module having a sampling frequency fs=F/M, F being a system clock, wherein consecutive sampling events for the ADCs are delayed by tD=1/(fs*M);
a first multiplexer connected to each of the ADCs and configured to concatenate output signals from the ADCs into a single data stream;
a reference ADC configured to receive and to convert the analog signal into a digital reference signal at an average sampling rate fref lower than fs, wherein each sampling instant of the reference ADC corresponds to a sampling instant of an ADC in the array of ADCs, and wherein the ADC to select for each reference ADC sampling instant is randomized over time; and
a reference ADC clock control module configured to control the sampling instants of the reference ADC;
a correction module connected to the first multiplexer to receive the data stream, the correction module comprising M correction blocks, each correction block being configured to correct a portion of the data stream AD-converted by a corresponding ADC, wherein an output signal from the reference ADC is provided to the error correction block configured to correct the portion of the data stream from the ADC from which the reference ADC sampling instant is selected; and
a second multiplexer connected to an output of each of the correction blocks and configured to combine output signals from each of the error correction blocks to provide an ADC-system output signal.

12. A method for analog-to-digital (AD) conversion in a system comprising a time-interleaved analog-to-digital converter (ADC) having an ADC-array comprising M, ADCs arranged in parallel, where M≥2, the method comprising:
receiving an analog signal;
AD-converting the signal by means of the ADC-array using a sampling rate $f_s$;
in a reference ADC, converting the analog signal into a digital reference signal at an average sampling rate $f_{ref}$ lower than $f_s$, wherein each sampling instant of the reference ADC corresponds to a sampling instant of an ADC in the array of ADCs, and wherein the ADC to select for each reference ADC sampling instant is randomized over time;
adjusting the digital signal outputs of the array of ADCs into a corrected digital output signal based on samples of the digital reference signal and the digital signals from the corresponding selected ADCs; and
selecting the ADC to sample based on an offset time toffset=D/(fs*M) added to the fundamental period $1/f_s$, such that the period between two consecutive sample events for the reference ADC is $1/f_s+D/(f_s*M)$, where D is a random integer D=0 . . . (M−1).

13. The method of claim 12, wherein the ADC to select for each reference ADC sampling instant is based on a pseudo-random pattern.

14. The method of claim 13, wherein the pseudo-random pattern is a predetermined pattern.

15. The method of claim 12, further comprising updating the correction module using a feedback error calculated as the difference between the output signal and the reference signal.

16. The method of claim 12, wherein the sampling rate fs is defined as fs=F/M, with F being a system clock frequency.

17. The method of claim 12, further comprising delaying consecutive sampling events for the ADC array by tD=1/(fs*M).

18. The method of claim 12, wherein the selecting the ADC to sample comprises selecting the ADC to sample based on the offset time toffset=D/(fs*M) added to the fundamental period R/fs such that the period between two consecutive sample events is R/fs+D/(fs*M), where D is a random integer D=0 . . . (M−1) and where R represents and undersampling factor that is a positive integer R≥1.

19. The method of claim 18, further comprising generating D based on a pseudo-random binary sequence.

20. The method of claim 12, further comprising correcting at least one of a DC error, a gain offset error, a time offset error, and a nonlinearity error.

21. A time-interleaved analog-to-digital converter (ADC) module, comprising:
an input port for to receiving an analog signal;
an ADC-array module for analog-to-digital conversion of the signal at a sampling rate $f_s$; the ADC-array module comprising an array of M ADCs;
a reference ADC module for converting the analog signal into a digital reference signal at an average sampling rate $f_{ref}$ lower than $f_s$, wherein each sampling instant of the reference ADC corresponds to a sampling instant of an ADC in the array of ADCs, and wherein the ADC to select for each reference ADC sampling instant is randomized over time; and
a correction module for adjusting the digital signal outputs of the array of ADCs into a corrected digital output signal based on samples of the digital reference signal and the digital signals from the corresponding selected ADCs; and a reference ADC clock control module configured to:
    control the sampling instants of the reference ADC;
    select the ADC to sample based on an offset time toffset=D/(fs*M) added to the fundamental period $1/f_s$, such that the period between two consecutive sample events for the reference ADC is $1/f_s$+D/($f_s$*M), where D is a random integer D=0 ... (M−1).

* * * * *